(12) United States Patent
Cho et al.

(10) Patent No.: US 9,390,784 B2
(45) Date of Patent: Jul. 12, 2016

(54) SEMICONDUCTOR MEMORY DEVICE AND SEMICONDUCTOR PACKAGE

(71) Applicant: SAMSUNG ELECTRONICS CO., LTD., Suwon-si, Gyeonggi-do (KR)

(72) Inventors: Min-hee Cho, Suwon-si (KR); Satoru Yamada, Seoul (KR); Sang-ho Shin, Yongin-si (KR); Sung-sam Lee, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 20 days.

(21) Appl. No.: 14/290,088

(22) Filed: May 29, 2014

(65) Prior Publication Data

US 2014/0369110 A1 Dec. 18, 2014

(30) Foreign Application Priority Data

Jun. 17, 2013 (KR) ........................ 10-2013-0069200

(51) Int. Cl.
*G11C 11/406* (2006.01)
*G11C 7/04* (2006.01)
*G11C 16/34* (2006.01)

(52) U.S. Cl.
CPC ............ *G11C 11/40626* (2013.01); *G11C 7/04* (2013.01); *G11C 16/3418* (2013.01)

(58) Field of Classification Search
None
See application file for complete search history.

(56) References Cited

U.S. PATENT DOCUMENTS

| | | | | |
|---|---|---|---|---|
| 5,278,796 | A * | 1/1994 | Tillinghast et al. | 365/211 |
| 6,373,768 | B2 * | 4/2002 | Woo | 365/211 |
| 7,177,218 | B2 | 2/2007 | Choi et al. | |
| 7,206,244 | B2 | 4/2007 | Cruz et al. | |
| 7,233,538 | B1 * | 6/2007 | Wu et al. | 365/222 |
| 7,315,792 | B2 | 1/2008 | Min et al. | |
| 7,474,577 | B2 * | 1/2009 | Crippa et al. | 365/211 |
| 7,843,752 | B2 | 11/2010 | Noh et al. | |
| 7,916,569 | B2 | 3/2011 | Kim et al. | |
| 8,122,187 | B2 | 2/2012 | Walker et al. | |
| 8,174,921 | B2 | 5/2012 | Kim et al. | |
| 2007/0058410 | A1 * | 3/2007 | Rajan | G11C 5/02 365/63 |
| 2007/0183191 | A1 * | 8/2007 | Kim | 365/175 |
| 2010/0265751 | A1 * | 10/2010 | Hong | G11C 5/06 365/51 |
| 2012/0163413 | A1 * | 6/2012 | Kim et al. | 374/152 |
| 2012/0287727 | A1 | 11/2012 | Wang | |
| 2013/0007895 | A1 | 1/2013 | Brolley et al. | |

FOREIGN PATENT DOCUMENTS

JP 2011-154744 A 8/2011

* cited by examiner

*Primary Examiner* — James G Norman
(74) *Attorney, Agent, or Firm* — Lee & Morse, P.C.

(57) ABSTRACT

A semiconductor memory device includes: a memory unit including a first memory sub region including a first memory cell and a second memory sub region including a second memory cell; a temperature information obtaining unit that obtains temperature information; a temperature estimation unit that estimates a first temperature of the first memory sub region and a second temperature of the second memory sub region based on the temperature information; a first sub region control unit that controls the first memory sub region based on the first temperature; and a second sub region control unit that controls the second memory sub region based on the second temperature.

6 Claims, 8 Drawing Sheets

SEMICONDUCTOR MEMORY DEVICE AND SEMICONDUCTOR PACKAGE

CROSS-REFERENCE TO RELATED APPLICATION

Korean Patent Application No. 10-2013-0069200, filed on Jun. 17, 2013, and entitled, "Semiconductor Memory Device and Semiconductor Package," is incorporated by reference herein in its entirety.

BACKGROUND

1. Field

One or more embodiments described herein relate to a semiconductor device.

2. Description of the Related Art

The electrical characteristics of a semiconductor memory device tend to vary according to operating temperature. This is especially true various types of memory devices. In an attempt to improve operation of a volatile memory device, the refresh period may be shortened in an attempt to reduce leakage current, which may increase with temperature. Also, transistor control voltages may be changed because threshold voltage may increase with temperature.

Also, because the area of a semiconductor memory device may increase with increases in capacity, a difference in operating temperatures may occur with respect to location. In particular, when a semiconductor memory device and an application processor are mounted in a single package, differences in operating temperature may increase with respect to location, e.g., the distance between the semiconductor memory device and application processor at relatively high operating temperature.

Moreover, when a semiconductor memory device is controlled based on a representative temperature, problems may occur. For example, data may be lost in a region having an operating temperature higher than the representative temperature. Also, excessive power may be consumed due to frequent refresh operations or unnecessarily high control voltages in regions having operating temperatures lower than the representative temperature. Also, to install a plurality of temperatures sensors in the semiconductor memory device in an attempt to solve these problems is space inefficient.

SUMMARY

In accordance with one embodiment, a semiconductor memory device includes a memory unit including a first memory sub region having a first memory cell and a second memory sub region having a second memory cell; a temperature information obtaining unit to obtain temperature information; a temperature estimation unit to estimate a first temperature of the first memory sub region and a second temperature of the second memory sub region based on the temperature information; a first sub region control unit that controls the first memory sub region based on the first temperature; and a second sub region control unit that controls the second memory sub region based on the second temperature.

The temperature information obtaining unit may include a temperature sensor to detect a representative temperature of the semiconductor memory device and to generate the temperature information corresponding to the representative temperature. The temperature information obtaining unit may receive the temperature information from an external device. The first temperature and the second temperature may be determined based on locations of the first memory sub region and the second memory sub region, respectively.

The temperature estimation unit may include a register to stores relationship information for estimating the first temperature and the second temperature from the temperature information.

The temperature information may include first temperature information and second temperature information, and the temperature estimation unit may include a register to store first relationship information for estimating the first temperature from the first temperature information and the second temperature information, and to store second relationship information for estimating the second temperature from the first temperature information and the second temperature information.

The first sub region control unit may refresh the first memory cell during a first refresh period corresponding to the first temperature, and the second sub region control unit may refresh the second memory cell during a second refresh period corresponding to the second temperature. When the first temperature is higher than the second temperature, the first refresh period may be shorter than the second refresh period.

The first memory sub region may have m number of refresh addresses, and the second memory sub region may have n number of refresh addresses, where m and n are natural numbers greater than 1. The first sub region control unit may include a first oscillator to generate a first pulse signal including m number of pulses during the first refresh period in correspondence to the first temperature, a first address counter to generate a first refresh address indicating a refresh address of the first memory sub region where a refresh operation is to be performed in response to the first pulse signal, and a first refresh circuit to refresh memory cells corresponding to the first refresh address in response to the first pulse signal.

The second sub region control unit may include a second oscillator to generate a second pulse signal including n number of pulses during the second refresh period in correspondence to the second temperature, a second address counter to generate a second refresh address indicating a refresh address of the second memory sub region where the refresh operation is to be performed in response to the second pulse signal, and a second refresh circuit to refresh memory cells corresponding to the second refresh address in response to the second pulse signal.

In another embodiment, the first memory sub region may have m number of refresh addresses and the second memory sub region may have n number of refresh addresses, where m and n are natural numbers greater than 1. The first sub region control unit may include a first pulse signal generation circuit to receive a third pulse signal and to generate a first pulse signal having m number of pulses during the first refresh period from the third pulse signal, a first address counter to generate a first refresh address indicating a refresh address of the first memory sub region where a refresh operation is to be performed in response to the first pulse signal, and a first refresh circuit to refresh memory cells corresponding to the first refresh address in response to the first pulse signal.

The second sub region control unit may include a second pulse signal generation circuit to receive the third pulse signal and to generate a second pulse signal having n number of pulses during the second refresh period from the third pulse signal, a second address counter to generate a second refresh address indicating a refresh address of the second memory sub region at which the refresh operation is to be performed in response to the second pulse signal, and a second refresh circuit to refresh memory cells corresponding to the second refresh address in response to the second pulse signal.

The first pulse signal generation circuit and the second pulse signal generation circuit may respectively include a first skip circuit and a second skip circuit that partially or wholly pass pulses of the third pulse signal. A pulse frequency of the third pulse signal may be equal to or higher than a higher of a pulse frequency of the first pulse signal and a pulse frequency of the second pulse signal. An internal oscillator may generate the third pulse signal. The third pulse signal may be generated in response to a refresh command received from an external device.

The first sub region control unit may control the first memory cell based on a first control signal corresponding to the first temperature, and the second sub region control unit may control the second memory cell based on a second control signal corresponding to the second temperature. When the first temperature is higher than the second temperature, the first control signal may be applied to the first memory cell corresponds to a voltage lower than a voltage of the second control signal applied to the second memory cell.

Each of the first memory cell and the second memory cell may include a transistor and a capacitor. Each of the first control signal and the second control signal may include a first value that corresponds to a turn on voltage, the turn on voltage may be applied to a gate of the transistor of a corresponding one of the first or second memory cells to enable the corresponding one of the first or second memory cells, and a second value that may correspond to a turn off voltage, the turn off voltage may be applied to the gate of the transistor of a corresponding one of the first or second memory cells to disable the corresponding one of the first or second memory cells.

The first sub region control unit may include a first voltage generator to generate the first control signal, and the second sub region control unit may include a second voltage generator to generate the second control signal. The first memory sub region may correspond to a first memory bank in which the first memory cell is arranged, and the second memory sub region may correspond to a second memory bank in which the second memory cell is arranged.

In accordance with another embodiment, a semiconductor memory device includes a memory unit including a plurality of memory banks; a temperature detection unit to detect a representative temperature; a temperature estimation unit to estimate a temperature of each of the plurality of memory banks based on the representative temperature; and a plurality of refresh units to refresh memory cells of a corresponding memory bank during a refresh period, wherein the memory cells are to be refreshed based on the temperature of each of the plurality of memory banks estimated by the temperature estimation unit.

In accordance with another embodiment, a semiconductor package includes at least one semiconductor memory chip which includes: a memory unit including a first memory sub region having a first memory cell and a second memory sub region having a second memory cell; a temperature information obtaining unit to obtain temperature information; a temperature estimation unit to estimate a first temperature of the first memory sub region and a second temperature of the second memory sub region based on the temperature information; a first sub region control unit that controls the first memory sub region based on the first temperature; and a second sub region control unit that controls the second memory sub region based on the second temperature.

The semiconductor package may include at least one application processor chip that is disposed above or below the at least one semiconductor memory chip, wherein the at least one application processor chip may generate the temperature information and wherein the temperature information obtaining unit may receive the temperature information from the at least one application processor chip.

The semiconductor package may include a memory controller to transmit refresh commands to the at least one semiconductor memory chip, wherein: the first sub region control unit may refresh memory cells of the first memory sub region during a first refresh period corresponding to the first temperature in response to some of the refresh commands, and the second sub region control unit may refresh memory cells of the second memory sub region during a second refresh period corresponding to the second temperature in response to some of the refresh commands.

The semiconductor package may include at least one application processor chip that is disposed above or below the at least one semiconductor memory chip, wherein the at least one semiconductor memory chip and the at least one application processor chip may communicate with each other using a through silicon via (TSV) that passes through at least one of the at least one semiconductor memory chip or the at least one application processor chip.

In accordance with another embodiment, a semiconductor package includes an application processor chip; a semiconductor memory chip disposed above or below the semiconductor memory chip; and at least one temperature sensor in at least one of the application processor chip or the semiconductor memory chip, wherein the semiconductor memory chip includes: a plurality of memory banks; a temperature information obtaining unit to obtain temperature information from the at least one temperature sensor; a temperature estimation unit to estimate a temperature of each of the plurality of memory banks; and a plurality of memory bank control units to control corresponding ones of the memory banks based on the corresponding estimated temperatures of the plurality of memory banks.

In accordance with another embodiment, an apparatus includes a signal line to receive temperature information of a memory; and a controller to estimate a first temperature of a first location of the memory and a second temperature of a second location of the memory based on the temperature information, and to control a first sub region of the memory based on the first temperature and to control a second sub region of the memory based on the second temperature, wherein the first temperature is different from the second temperature.

The controller may control the first sub region independently from the second sub region. The controller may include a first control circuit to control the first sub region and a second control circuit to control the second sub region independently from the first sub region. The controller may include the signal line.

The temperature information may be indicative of a representative temperature of the memory. The controller may receive information indicative of the first temperature and the second temperature from a lookup table that stores a predetermined relationship between the representative temperature and the first temperature and the second temperature.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
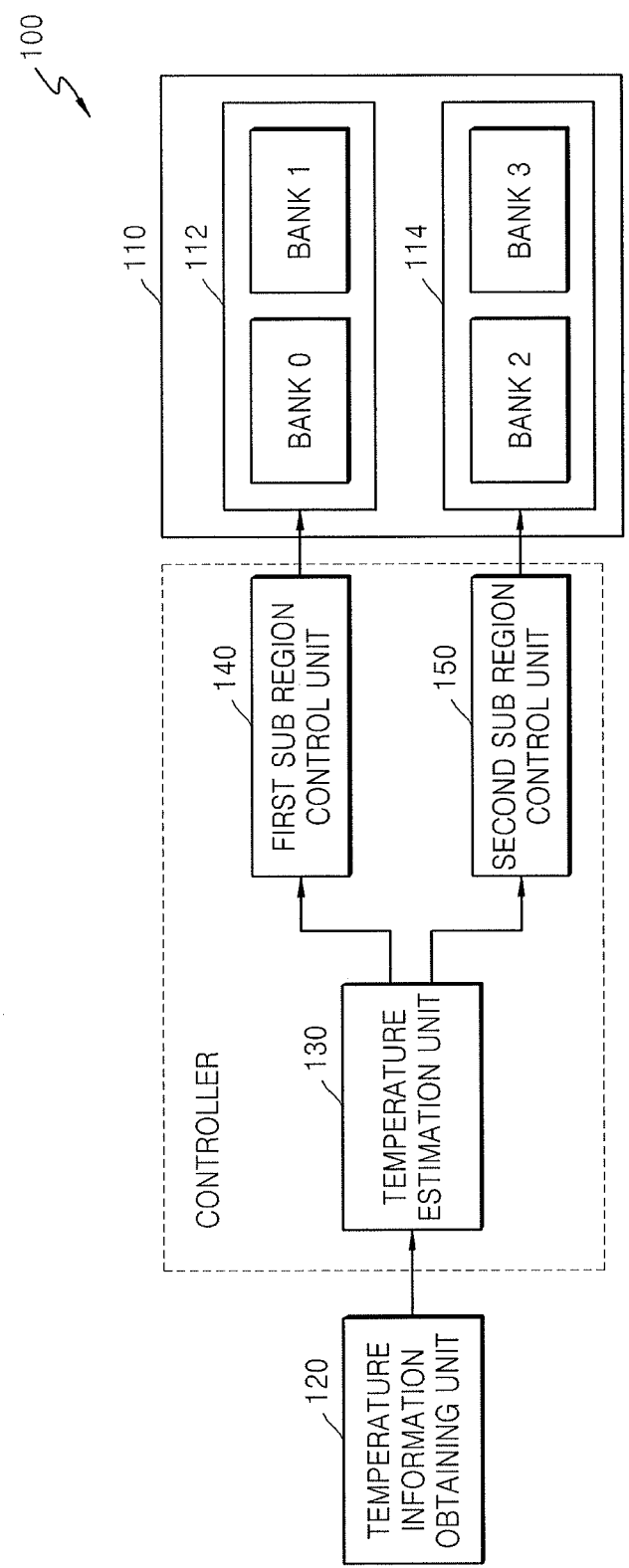
FIG. 1 illustrates one embodiment of a semiconductor memory device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a semiconductor memory device 100 which includes a memory unit 110, a temperature information obtaining unit 120, a temperature estimation unit 130, a first sub region control unit 140, and a second sub region control unit 150. The temperature estimation unit 130, the first sub region control unit 140, and the second sub region control unit 150 may be considered to correspond to a controller.

The semiconductor memory device 100 may be a volatile memory device such as dynamic random-access memory (DRAM) or a non-volatile memory device such as a flash memory device. The semiconductor memory device 100 may be solely packaged or may constitute a semiconductor memory package in which the same type of semiconductor memory devices are stacked. The semiconductor memory device 100 may be an element of a semiconductor integrated package packaged with different types of semiconductor chips, such as an application processor chip and/or different types of semiconductor memory chips. In this regard, the semiconductor integrated package may be a system-on-chip, a package-on-package, or a system-in-package.

The memory unit 110 may include a first memory sub region 112 and a second memory sub region 114. As exemplarily shown in FIG. 1, the first memory sub region 112 may include first and second memory banks BANK0 and BANK1. The second memory sub region 114 may include third and fourth memory banks BANK2 and BANK3. In other embodiments, the memory unit 110 may include a greater number of memory sub regions, one memory sub region may correspond to one memory bank, or one memory bank may be divided into two or more memory sub regions. The memory unit 110 includes the four memory banks BANK0, BANK1, BANK2, and BANK3 in FIG. 1 merely for illustrative purposes.

In other embodiments, the memory unit 110 may include a smaller or greater number of memory banks. When the semiconductor memory device 100 has a structure in which two or more semiconductor memory chips are stacked, the first memory sub region 112 and the second memory sub region 114 may be provided in different layers. Also, the first memory sub region 112 and the second memory sub region 114 included in the memory unit 110 may be independently controlled.

A plurality of memory cells including a first memory cell are arranged in the first memory sub region 112. A plurality of memory cells including a second memory cell are arranged in the second memory sub region 114.

The temperature information obtaining unit 120 obtains temperature information. The temperature information may indicate a temperature of a specific part of the semiconductor memory device 100. For example, the semiconductor memory device 100 may include a temperature sensor installed in a specific location, for example, a center of the semiconductor memory device 100. The temperature sensor may detect the temperature of the semiconductor memory device 100 and output the temperature information.

The temperature sensor installed in the semiconductor memory device 100 may detect a representative temperature of the semiconductor memory device 100. The semiconductor memory device 100 may be controlled based on the representative temperature. However, a temperature gradient may internally occur in the semiconductor memory device 100.

In particular, in the semiconductor integrated package packaged with the semiconductor memory device 100 and the application processor chip, a temperature of the application processor chip (having area is smaller than that of the semiconductor memory device 100) may be generally higher than that of the semiconductor memory device 100. As a result, a temperature of a part of the semiconductor memory device 100 adjacent to the application processor chip may be relatively high. Conversely, a temperature of a part of the semiconductor memory device 100 away from the application processor chip may be relatively low. A maximum temperature difference may be actually approximately 20° C. with respect to a location of the semiconductor memory device 100.

When an overall region of the semiconductor memory device 100 is controlled based on the representative temperature, the semiconductor memory device 100 may not maintain its optimal (or a predetermined) temperature state. For example, because the temperature of a part of the semiconductor memory device 100 which is higher than the representative temperature is controlled based on a low temperature, data loss may occur.

Also, because a part of the semiconductor memory device 100 having a temperature lower than the representative temperature is controlled based on a high temperature, a short refresh period may be unnecessarily set. This may lead to unnecessary power consumption. When a refresh operation is performed based on a temperature approximately 6.5° C. higher than an actual temperature, approximately 10% of power is additionally consumed.

The temperature information may be a temperature of outside and/or adjacent to the semiconductor memory device 100. For example, the temperature information obtaining unit 120 may obtain temperature information from an external device connected to the semiconductor memory device 100.

The temperature information obtaining unit 120 may obtain a plurality of items of temperature information. For example, the temperature information obtaining unit 120 may receive first temperature information from a first external device and second temperature information from a second external device. As another example, the temperature information obtaining unit 120 may obtain first temperature information using an internal temperature sensor and second temperature information from an external device.

The temperature estimation unit 130 may estimate a first temperature of the first memory sub region 112 and a second temperature of the second memory sub region 114 based on the temperature information obtained by the temperature information obtaining unit 120. As previously described, because a temperature gradient may internally occur in the semiconductor memory device 100, temperatures of the first memory sub region 112 and the second memory sub region 114 disposed in different locations may be different.

For example, when the application processor chip that generates a relatively large amount of heat is disposed in a lower or upper portion of the first memory sub region 112, the temperature of the first memory sub region 112 may be higher than that of the second memory sub region 114. In this case, although the temperature sensor at the center of the semiconductor memory device 100 indicates 90° C., the temperatures of the first memory sub region 112 and the second memory sub region 114 may actually be 95° C. and 85° C., respectively.

Also, one or more electrical characteristics of memory cells may be different according to temperature. For example, in a volatile memory device, charge leakage of memory cells may increase in accordance with an increase in temperature.

Also, a refresh period of a volatile memory device may be reduced in an attempt to avoid data loss. For example, when a temperature of the volatile memory device is 95° C., the refresh period may be halved compared to when the temperature of the volatile memory device is 85° C. Nevertheless, when the refresh period is set based on 90° C. measured by the temperature sensor, data stored in memory cells in the first memory sub region 112 with the temperate of 95° C. may be lost, and memory cells in the second memory sub region 114 with the temperate of 85° C. may be unnecessarily refreshed frequently, which leads to excessive power consumption.

Also, one or more electrical characteristics of the transistors in the memory cells may be different in accordance with temperature. Because a threshold voltage of a transistor tends to increase when temperature decreases, the control voltage used to turn on the transistor may be set high. In this case, a memory cell located in a high temperature region may use an unnecessarily high control voltage, which may cause excessive power consumption.

Therefore, according to one approach, the temperature of each memory sub region may be accurately measured and the memory sub regions may be independently controlled based on the measured temperatures. However, when a temperature sensor is installed in each memory sub region, the area and size of the device may increase.

The temperature estimation unit 130 may estimate the temperature of each memory sub region in the memory unit 110 based on temperature information obtained by the temperature information estimation unit 120. The estimated temperature may be temperature of a part with the highest temperature in a corresponding memory sub region.

The temperature estimation unit 130 may include a register that stores information used to estimate the temperature of each memory sub region. The register may store relationship information regarding a relationship between the temperature information and the temperature of each memory sub region. The relationship information may be stored as a function or in a lookup table form.

The temperature estimation unit 130 may estimate the first temperature of the first memory sub region 112 and the second temperature of the second memory sub region 114 from the temperature information using the relationship information stored in the register. The first temperature and the second temperature estimated by the temperature estimation unit 130 may be stored in the register.

The temperature estimation unit 130 may update the temperature information every predetermined time period, and estimate the first temperature of the first memory sub region 112 and the second temperature of the second memory sub region 114 again based on the updated temperature information.

The first sub region control unit 140 may control the memory cells in the first memory sub region 112 based on the first temperature. The second sub region control unit 150 may control the memory cells included in the second memory sub region 114 based on the second temperature. The first memory sub region 112 and the second memory sub region 114 may be independently operated by the first sub region control unit 140 and the second sub region control unit 150.

For example, the memory cells included in the first memory sub region 112 may be refreshed according to a first refresh period corresponding to the first temperature, and the memory cells included in the second memory sub region 114 may be refreshed according to a second refresh period corresponding to the second temperature. A first control voltage corresponding to the first temperature may be applied to the first memory sub region 112. A second control voltage corresponding to the second temperature may be applied to the second memory sub region 114.

Figure 2:
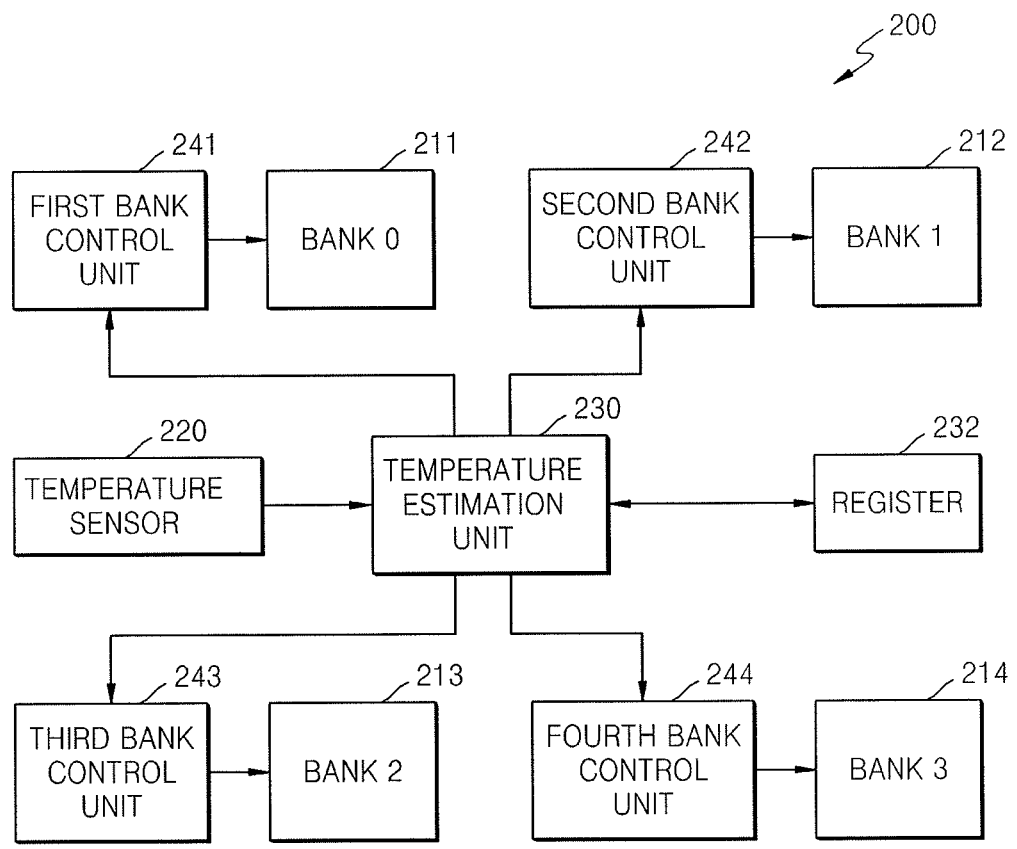
FIG. 2 illustrates another embodiment a semiconductor memory device.

FIG. 2 illustrates another embodiment a semiconductor memory device 200 which includes first through fourth memory banks 211-214, first through fourth bank control units 241-244 that independently control respective ones of the first through fourth memory banks 211-214 according to temperature, a temperature sensor 220, and a temperature estimation unit 230. While semiconductor memory device 200 is illustrated to include four memory banks, a greater or smaller number of memory banks may be included in other embodiments.

Also, FIG. 2 shows that the first through fourth memory banks 211-214 are independently controlled according to temperature. In other embodiments, memory sub regions including two or more memory banks may be independently controlled according to temperature. Some regions included in one memory bank may be independently controlled according to temperature. For illustrative purposes, semiconductor memory device 200 is illustrated to include first through fourth memory banks 211-214, which are independently controlled according to temperature.

Each of the first through fourth memory banks 211-214 includes a plurality of word lines, a plurality of bit lines, and a plurality of memory cells disposed at points where the word lines and the bit lines cross each other. Each of the first through fourth memory banks 211-214 also includes a row decoder for selecting the word lines corresponding to row addresses and a column decoder for selecting the bit lines corresponding to column addresses.

The semiconductor memory device 200 may include temperature sensor 220 that detects a representative temperature of the semiconductor memory device 200. The temperature sensor 220 may correspond to the temperature information obtaining unit 120 of the semiconductor memory device 100 of FIG. 1. The representative temperature detected by the temperature sensor 220 may correspond to temperature information. The temperature sensor 220 may be referred to as a temperature detection unit.

The temperature sensor 220 may be disposed at a center of the semiconductor memory device 200, or in a part of the semiconductor memory device 200 having the highest temperature.

The temperature sensor 220 may generate temperature data corresponding to temperature of a location in which the temperature sensor 220 is disposed. For example, the temperature sensor 220 may generate a voltage signal or a current signal corresponding to temperature of a specific location. In this case, the temperature sensor 220 may be configured as an electric device through which current varies according to temperature, for example, a diode or a transistor.

The semiconductor memory device 200 may include only one temperature sensor 220. As described above, when a plurality of temperature sensors 220 are installed in the semiconductor memory device 200, the area of the device may be increased.

The temperature estimation unit 230 may estimate a temperature of each of the first through fourth memory banks 211-214 based on the representative temperature. Relationship information used to estimate the temperature of each of the first through fourth memory banks 211-214 from the representative temperature may be stored in a register 232. The relationship information may be stored as a function or in a lookup table form. For example, the relationship information may be defined in the form of the following function:

$$t_1 = a_1 t_r + b_1$$

$$t_2 = a_2 t_r + b_2$$

$$t_3 = a_3 t_r + b_3$$

$$t_4 = a_4 t_r + b_4$$

In the above equations, $t_1$-$t_4$ denote the estimated temperatures of the first through fourth memory banks 211-214, and $t_r$ denotes the representative temperature of the semiconductor memory device 200 detected by the temperature sensor 220. Coefficients $a_1$-$a_4$, and $b_1$-$b_4$ may be determined according to locations of the first through fourth memory banks 211-214. The coefficients $a_1$-$a_4$, and $b_1$-$b_4$ may be calculated by using thermodynamics in view of the locations of the first through fourth memory banks 211-214, a heat environment in the peripheral of the semiconductor memory device 200, a thermal conductivity of materials forming the semiconductor memory device 200, etc., and may be derived by experimentally analyzing a relationship between the representative temperature $t_r$ and the temperatures $t_1$-$t_4$ of the first through fourth memory banks 211-214.

In general, since the relationship between the representative temperature $t_r$ and the temperatures $t_1$-$t_4$ is approximately directly proportional, the coefficients $a_1$-$a_4$ may have positive values. The coefficients $b_1$-$b_4$ may be determined according to the heat environment in the peripheral of the semiconductor memory device 200.

For example, when an application processor chip having a great heating value compared to the semiconductor memory device 200 is disposed in a top or bottom portion of the first memory bank 211, the coefficient $b_1$ may have a positive value. A first application processor chip is disposed in the top or bottom portion of the first memory bank 211, a second application processor chip is disposed in a top or bottom portion of the fourth memory bank 214, the coefficients $b_1$ and $b_4$ may have positive values.

The register 232 may store the coefficients $a_1$-$a_4$ and $b_1$-$b_4$. The temperature estimation unit 230 may respectively estimate temperatures $t_1$-$t_4$ of the first through fourth memory banks 211-214 using the coefficients $a_1$-$a_4$ and $b_1$-$b_4$. For example, the relationship information may be non-linearly defined according to a range of the representative temperature $t_r$ as follows.

If $t_r < 70$, $t_1 = a_1 t_r + b_1$

If $t_r \geq 70$, $t_1 = c_1 t_r + d_1$

In other embodiments, the relationship information may be defined using other functions such as a quadric function or an exponential function. For example, an offset between a representative temperature and an estimated temperature of each memory bank may be stored in the register 232.

The temperature estimation unit 230 may estimate temperatures $t_1$-$t_4$ of the first through fourth memory banks 211-214 using the relationship information stored in the register 232. For example, when the relationship information is stored in lookup table form, the estimated temperatures $t_1$-$t_4$ of the first through fourth memory banks 211-214 according to the representative temperature $t_r$ may be stored as a table. Also, the relationship information may be adjusted during a calibration process or a test process of the semiconductor memory device 200.

The first through fourth memory control units 241-244 may independently control the first through fourth memory banks 211-214 based on the corresponding estimated temperatures $t_1$-$t_4$. In one embodiment, the temperature estimation unit 230 may generate digital signals corresponding to the estimated temperatures $t_1$-$t_4$. The first through fourth memory control units 241-244 receive the corresponding digital signals, and control the first through fourth memory banks 211-214 according to the estimated temperatures $t_1$-$t_4$ indicated by the digital signals. The digital signals may be transmitted to the first through fourth memory control units 241-244, for example, through separate wirings, although this is not a necessity. Also, the digital signals may be transmitted to the first through fourth memory control units 241-244 in a time divisional way.

In accordance with another example, the temperature estimation unit 230 may generate analog signals corresponding to the estimated temperatures $t_1$-$t_4$. The analog signals may be voltage signals or current signals that are proportional (or inversely proportional) to the estimated temperatures $t_1$-$t_4$. For example, the temperature estimation unit 230 may include a circuit that receives a voltage signal or a current signal of the temperature sensor 220 output in response to the temperature of the location in which the temperature sensor 220 is installed. The temperature estimation unit 230 may then output a voltage signal or a current signal that is proportional (or inversely proportional) to the estimated temperatures $t_1$-$t_4$ based on the received voltage signal or current signal.

The circuit may include a voltage splitter that splits an input voltage signal and generates a plurality of output voltage signals. The voltage splitter may include serially connected variable resistors. In another example, the circuit may include a current mirror circuit that generates a plurality of output current signals based on an input current signal.

The first through fourth memory control units 241-244 may receive the corresponding analog signals and control the first through fourth memory banks 211-214 according to the estimated temperatures $t_1$-$t_4$ indicated by the analog signals.

In another example, the temperature estimation unit 230 may store information regarding the estimated temperatures $t_1$-$t_4$ in the register 232. The first through fourth memory control units 241-244 may read the information regarding the estimated temperatures $t_1$-$t_4$ stored in the register 232, and control the first through fourth memory banks 211-214 according to the estimated temperatures $t_1$-$t_4$. The information regarding the estimated temperatures $t_1$-$t_4$ may be stored, for example, in a separate register.

The first through fourth memory control units 241-244 may respectively control the first through fourth memory banks 211-214 at control voltages corresponding to the estimated temperatures $t_1$-$t_4$, and respectively control refresh operations of memory cells in the first through fourth memory banks 211-214 during refresh periods corresponding to the estimated temperatures $t_1$-$t_4$.

For example, when the first through fourth memory control units 241-244 respectively control the refresh operations of the first through fourth memory banks 211-214, refresh information regarding temperatures and refresh periods for the memory cells may be stored in the register 232. The refresh information may be stored in function or lookup table form. The first through fourth memory control units 241-244 may determine the refresh periods corresponding to the estimated temperatures $t_1$-$t_4$ of the first through fourth memory banks 211-214 using the refresh information stored in the register 232 and may perform refresh operations during the refresh periods.

In another example, the temperature estimation unit 130 may respectively provide the first through fourth memory banks 211-214 with information regarding the refresh periods corresponding to the estimated temperatures $t_1$-$t_4$, in addition to or instead of the information regarding the estimated temperatures $t_1$-$t_4$.

In another example, each of the first through fourth memory control units 241-244 may include a circuit that receives analog signals corresponding to the estimated temperatures $t_1$-$t_4$ and that adjusts the refresh periods based on the analog signals.

Therefore, when the estimated temperatures $t_1$-$t_4$ of the first through fourth memory banks 211-214 are different, the refresh periods of the first through fourth memory banks 211-214 may be different.

For example, consider the case where the estimated temperature $t_1$ of the first memory bank 211 is 95° C., the estimated temperatures $t_2$ and $t_3$ of the second and third memory banks 212 and 213, respectively, are 90° C., and the estimated temperature $t_4$ of the fourth memory bank 214 is 85° C. In this case, the memory cells of the first memory bank 211 may be refreshed every 3.2 μs, the memory cells of the second and third memory banks 212 and 213 may be refreshed every 4.8 μs, and the memory cells of the fourth memory bank 214 may be refreshed every 6.4 μs. These numerical values are merely illustrative of one embodiment. Different numerical values may be used in other embodiments.

Figure 3:
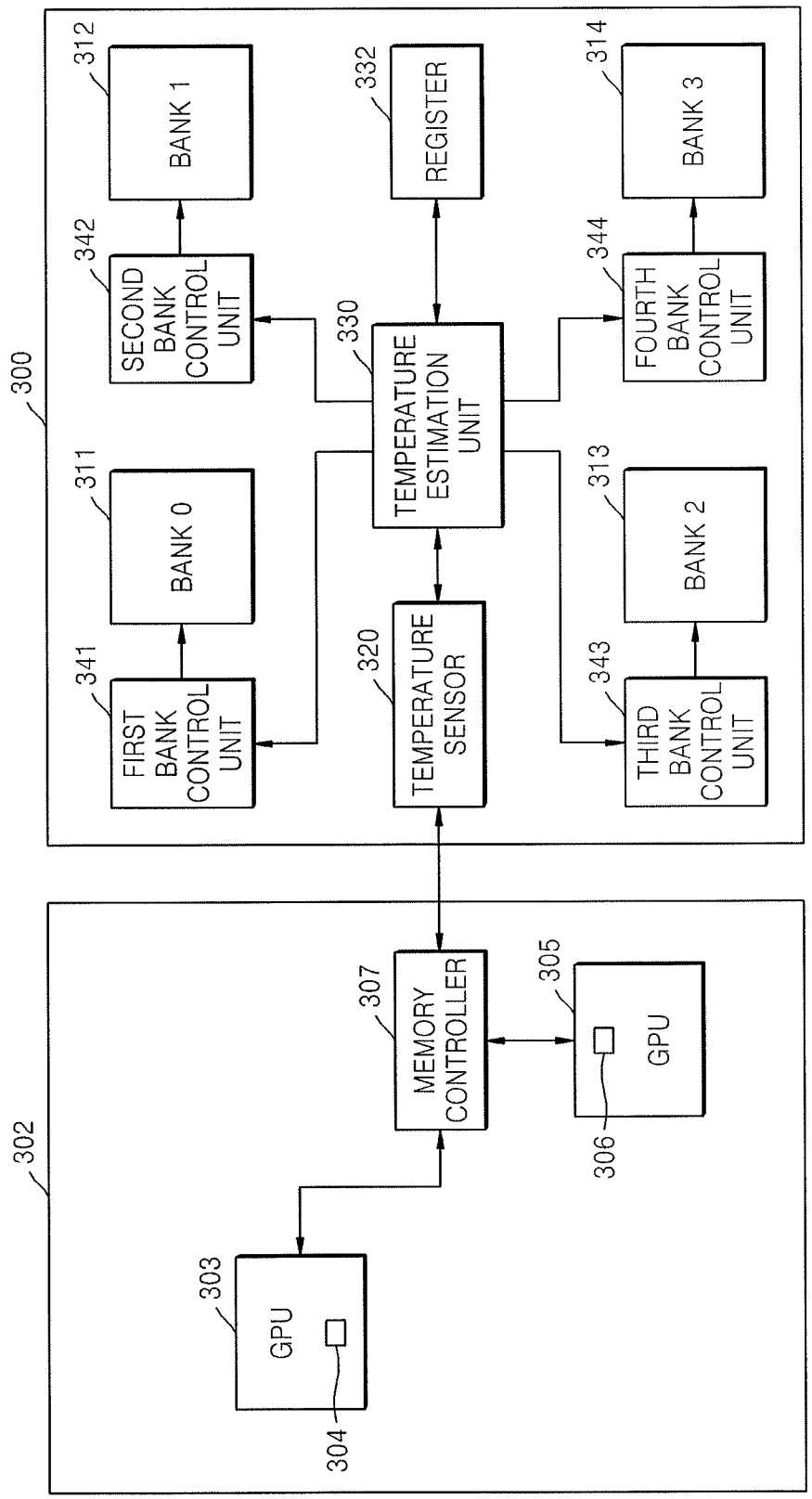
FIG. 3 illustrates another embodiment a semiconductor memory device.

FIG. 3 illustrates another embodiment of a semiconductor memory device 300 which includes first through fourth memory banks 311-314, first through fourth bank control units 341-344, a communication unit 320, and a temperature estimation unit 330. The semiconductor memory device 300 is similar to the semiconductor memory device 200 of FIG. 2, except as described below.

The semiconductor memory device 300 may communicate with a semiconductor device 302 using communication unit 320. The semiconductor device 302 may be disposed adjacent to the semiconductor memory device 300 and may influence the temperature of the semiconductor memory device 300. The semiconductor memory device 300 and the semiconductor device 302 may be stacked on top of each other to configure one semiconductor integrated package, but this is not a necessity.

As shown in FIG. 3, the semiconductor device 302 may include a first application processor unit 303 and a second application processor unit 305. In other embodiments, the semiconductor device 302 may include a different (smaller or greater) number of application processor units. The first application processor unit 303 and the second application processor unit 305 may be included in the semiconductor device 302 to configure one semiconductor chip in FIG. 3. In other embodiments, the first application processor unit 303 and the second application processor unit 305 may be configured in separate semiconductor chips or semiconductor packages.

The first application processor unit 303 may be, for example, a central processing unit (CPU). The second application processor unit 305 may be, for example, a graphics processing unit (GPU). Thus, the first application processor unit 303 and the second application processor unit 305 are referred to as the CPU 303 and the GPU 305, respectively.

The semiconductor device 302 may be configured as one semiconductor chip including a CPU block including the CPU 303 and a GPU block including the GPU 305. As shown in FIG. 3, the CPU block and the GPU block may be spaced apart from each other. In general, since power consumption of the CPU block may be greater than that of the GPU block in some applications, a temperature gradient may occur in the semiconductor device 302. That is, the temperature of the semiconductor device 302 in which the CPU block is disposed may be the highest.

The semiconductor device 302 may include a memory controller 307, through which the CPU 303 and the GPU 305 may access a memory region of the semiconductor memory device 300. Although the memory controller 307 is shown to be disposed inside the semiconductor device 302 in FIG. 3, the memory controller 307 may be disposed in another semiconductor device or inside the semiconductor memory device 300 in other embodiments. For example, the memory controller 307 may be configured in a separate semiconductor chip or semiconductor package.

The CPU 303 and the GPU 305 may transmit refresh commands to the semiconductor memory device 300 through memory controller 307.

The semiconductor device 302, including the first application processor unit 303 and the second application processor unit 305, generally consumes power and radiates heat greater than the semiconductor memory device 300. Thus, the temperatures of the CPU 303 and the GPU 305 may be managed. In one embodiment, the CPU 303 and the GPU 305 may respectively include a first temperature sensor 304 and a second temperature sensor 306 that may measure internal temperatures at different locations. These internal temperatures may then be used for temperature management.

When the semiconductor memory device 300 and the semiconductor device 302 are disposed adjacent to each other, the temperature of the semiconductor memory device 300 may be influenced by the temperature of the semiconductor device 302.

The semiconductor memory device 300 may obtain information regarding a first application processor (AP) temperature detected by the first temperature sensor 304 of the CPU 303 and information regarding a second AP temperature detected by the second temperature sensor 306 of the GPU 305. The semiconductor memory device 300 may receive data regarding the first AP temperature and the second AP temperature using the memory controller 307 and the communication unit 320.

In another example, the semiconductor memory device 300 may obtain a signal corresponding to the first AP temperature and the second AP temperature, or the information regarding the first AP temperature and the second AP temperature, in a current signal form or a voltage signal form.

In the present embodiment, the communication unit 320 may receive the information regarding the first AP temperature and the second AP temperature from the memory controller 307 and provide this information to the temperature estimation unit 330 as a first reference temperature and a second reference temperature.

The temperature estimation unit 330 may estimate temperature of each of the first through fourth memory banks 311-314 based on the first reference temperature and the second reference temperature. Relationship information used to estimate first through fourth temperatures of the first through fourth memory banks 311-314 from the first reference temperature and the second reference temperature may be stored in a register 332. The relationship information may be stored as a function or in lookup table form.

When the relationship information is in the form of a function, relationship functions may be as follows:

$$t_1 = a_1 t_{r1} + b_1 t_{r2} + c_1$$

$$t_2 = a_2 t_{r1} + b_2 t_{r2} + c_2$$

$$t_3 = a_3 t_{r1} + b_3 t_{r2} + c_3$$

$$t_4 = a_4 t_{r1} + b_4 t_{r2} + c_4$$

In these functions, $t_1$-$t_4$ denote first through fourth estimated temperatures of the first through fourth memory banks 311-314, $t_{r1}$ denotes the first reference temperature, and $t_{r2}$ denotes the second reference temperature. Coefficients $a_1$-$a_4$, $b_1$-$b_4$, and $c_1$-$c_4$ may be determined according to locations of the first through fourth memory banks 311-314 and locations of the CPU 303 and the GPU 305. The coefficients $a_1$-$a_4$, $b_1$-$b_4$, $c_1$-$c_4$ may be calculated by using thermodynamics in consideration of a thermal conductivity of materials forming the semiconductor memory device 300, distances between the first through fourth memory banks 311-314 and the CPU 303 and the GPU 305, heating values, etc. In another example, the coefficients $a_1$-$a_4$, $c_1$-$c_4$ may be derived experimentally by analyzing a relationship between the first reference temperature $t_{r1}$ and the second reference temperature $t_{r2}$ and the temperatures $t_1$-$t_4$ of the first through fourth memory banks 311-314.

For example, when the CPU 303 is closest to the first memory bank 311 and farthest from the fourth memory bank 314, and the GPU 305 is closest to the fourth memory bank 314 and farthest from the first memory bank 311, the coefficient $a_1$ may be the greatest and the coefficient $a_4$ may be the smallest. Also, $t_{r1}$ denotes the first reference temperature indicating the internal temperature of the CPU 303, $t_{r2}$ denotes the second reference temperature indicating the internal temperature of the GPU 305, and the temperatures of the first through fourth memory banks 311-314 may be lower than the first reference temperature $t_{r1}$ and the second reference temperature $t_{r2}$. Thus, the coefficients $a_1$-$a_4$, $b_1$-$b_4$, and $c_1$-$c_4$ may have negative values. The register 332 may store the coefficients $a_1$-$a_4$, $b_1$-$b_4$, and $c_1$-$c_4$.

The aforementioned relationship functions are merely illustrative of one embodiment. In other embodiments, the relationship functions may be different, e.g., may be a high order polynomial function or a nonlinear function. Although the relationship functions are defined as functions regarding the first reference temperature $t_{r1}$ and the second reference temperature $t_{r2}$, the relationship functions may be defined as functions regarding first through third reference temperature $t_{r1}$, $t_{r2}$, $t_{r3}$. The third reference temperature $t_{r3}$ may be provided from another application processor unit or another type of memory unit.

Also, the relationship functions may be defined as functions regarding the first reference temperature $t_{r1}$, the second reference temperature $t_{r2}$, and the representative temperature $t_r$. In this regard, the first reference temperature $t_{r1}$ and the second reference temperature $t_{r2}$ may be provided from an external device. The representative temperature $t_r$ may be provided from a temperature sensor inside the semiconductor memory device 300.

For example, consider the case where the CPU 303 is stacked on the first memory bank 311, the GPU 305 is stacked on the fourth memory bank 314, the temperature of the CPU 303 is 120° C., and the temperature of the GPU 305 is 70° C. In this case, the first temperature $t_1$ of the first memory bank 311 may be estimated as 85° C., the second temperature $t_2$ and the third temperature $t_3$ of the second and third memory banks 312, 313 may be estimated as 75° C., and the fourth temperature $t_4$ of the fourth memory bank 314 may be estimated as 65° C. using the relationship functions.

The first through fourth bank control units 341-344 may respectively control the first through fourth memory banks 311-314 based on the first through fourth estimated temperatures $t_1$-$t_4$.

When the first through fourth bank control units 341-344 respectively control refresh operations of memory cells included in the first through fourth memory banks 311-314, the semiconductor memory device 300 may receive refresh commands from the memory controller 307. The refresh commands may be transmitted from the CPU 303 and/or the GPU 305. The first through fourth bank control units 341-344 may respectively refresh the memory cells included in the first through fourth memory banks 311-314 in response to the refresh commands. The first through fourth bank control units 341-344 may skip some of the refresh commands to refresh the memory cells during refresh periods corresponding to the first through fourth estimated temperatures $t_1$-$t_4$.

For example, in one embodiment, it may be assumed that all the memory cells included in the first through fourth memory banks 311-314 are refreshed when 1000 refresh operations are performed. That is, because one refresh operation is performed on memory cells connected to a same word line, it may be assumed that each of the first through fourth memory banks 311-314 includes 1000 word lines.

In the present embodiment, a refresh period (or a refresh interval) may correspond to a time taken to refresh one memory cell, so as to prevent data stored in the memory cell from being lost. The 1000 refresh operations may be performed within one refresh period to refresh all the memory cells included in the first through fourth memory banks 311-314. Thus, a refresh operation may be performed at a time obtained by dividing the refresh period by the number of times the refresh operations are performed. In this regard, the time obtained by dividing the refresh period by the number of times the refresh operations are performed is a refresh cycle or a refresh cycle time.

Also, in one embodiment, it may be assumed (as described above) that the memory cells of the first memory bank 311 are refreshed during a first refresh period of 3.2 μs, the memory cells of the second and third memory banks 312 and 313 are refreshed during second and third refresh periods of 4.8 μs, and the memory cells of the fourth memory bank 314 is refreshed during a fourth refresh period of 6.4 μs. In this case, all the memory cells included in the first memory bank 311 may be refreshed within the first refresh period of 3.2 μs only when the first memory bank 311 performs the refresh operation every first refresh cycle time of 3.2 ns. The second and third memory banks 312 and 313 may perform the refresh operations every second and third refresh cycle time of 4.8 ns. The fourth memory bank 314 may perform the refresh operation every fourth refresh cycle time of 6.4 ns.

That is, the first bank control unit 341 may sequentially enable word lines of the first memory bank 311 every first refresh cycle time of 3.2 ns. The second and third bank control units 342 and 343 may sequentially enable word lines of the second and third memory banks 312 and 313 every second and third refresh cycle time of 4.8 ns. The fourth bank control unit 344 may sequentially enable word lines of the fourth memory bank 314 every fourth refresh cycle time of 6.4 ns.

Therefore, the first through fourth bank control units 341-344 may receive the refresh commands at least every same time as the shortest refresh cycle time of 3.2 ns. To this end, the memory controller 307 may transmit the refresh commands every first refresh cycle time of 3.2 ns. The memory controller 307 may receive information regarding the highest estimated temperature among the first through fourth estimated temperatures $t_1$-$t_4$ by using the communication unit 320, and may transmit the refresh commands every refresh cycle time corresponding to the highest estimated temperature.

In this case, the first bank control unit 341 may perform the refresh operation in response to all the refresh commands. All the memory cells included in the first bank control unit 341 may be refreshed within the first refresh period of 3.2 μs.

The second and third bank control units 342 and 343 may skip one of three refresh commands and perform the refresh operations in response to the two refresh commands. The second and third bank control units 342 and 343 may receive 1500 refresh commands to perform the 1000 refresh operations, and thus it takes a time of 6.4 μs. That is, all the memory cells included in the second and third bank control units 342 and 343 may be refreshed within the second and third refresh periods of 4.8 μs.

The fourth bank control unit 344 may perform the refresh operation in response to one of two refresh commands. The fourth bank control unit 344 needs to receive 2000 refresh commands to perform the 1000 refresh operations, and thus it takes a time of 6.4 μs. That is, all the memory cells included in the fourth bank control unit 344 may be refreshed within the fourth refresh period of 6.4 μs.

The memory controller 307 may transmit the refresh commands in a shorter time than 3.2 ns, for example, 1.6 ns or 2.4 ns. In this case, the first through fourth bank control units 341-344 may perform the refresh operations in response to some of the received refresh commands.

For example, when the memory controller 307 transmits refresh commands every 2.4 ns, the first bank control unit 341 may skip ⅓ of the refresh commands and perform the refresh operation in response to the remaining ⅔ of the refresh commands. The second and third bank control units 342 and 343 may skip ½ of the refresh commands and perform the refresh operations in response to the remaining ½ of the refresh commands. The fourth bank control unit 344 may skip ⅔ of the refresh commands and perform the refresh operation in response to the remaining ⅓ of the refresh commands.

The first through fourth bank control units 341-344 may determine a skip ratio used to skip the refresh commands, or a pass ratio used to pass the refresh commands, based on the first through fourth estimated temperatures $t_1$-$t_4$ of the corresponding first through fourth memory banks 311-314. Each of the first through fourth bank control units 341-344 may include a skip circuit that skips some of the received refresh commands at the skip ratio and passes the remaining refresh commands.

Figure 4:
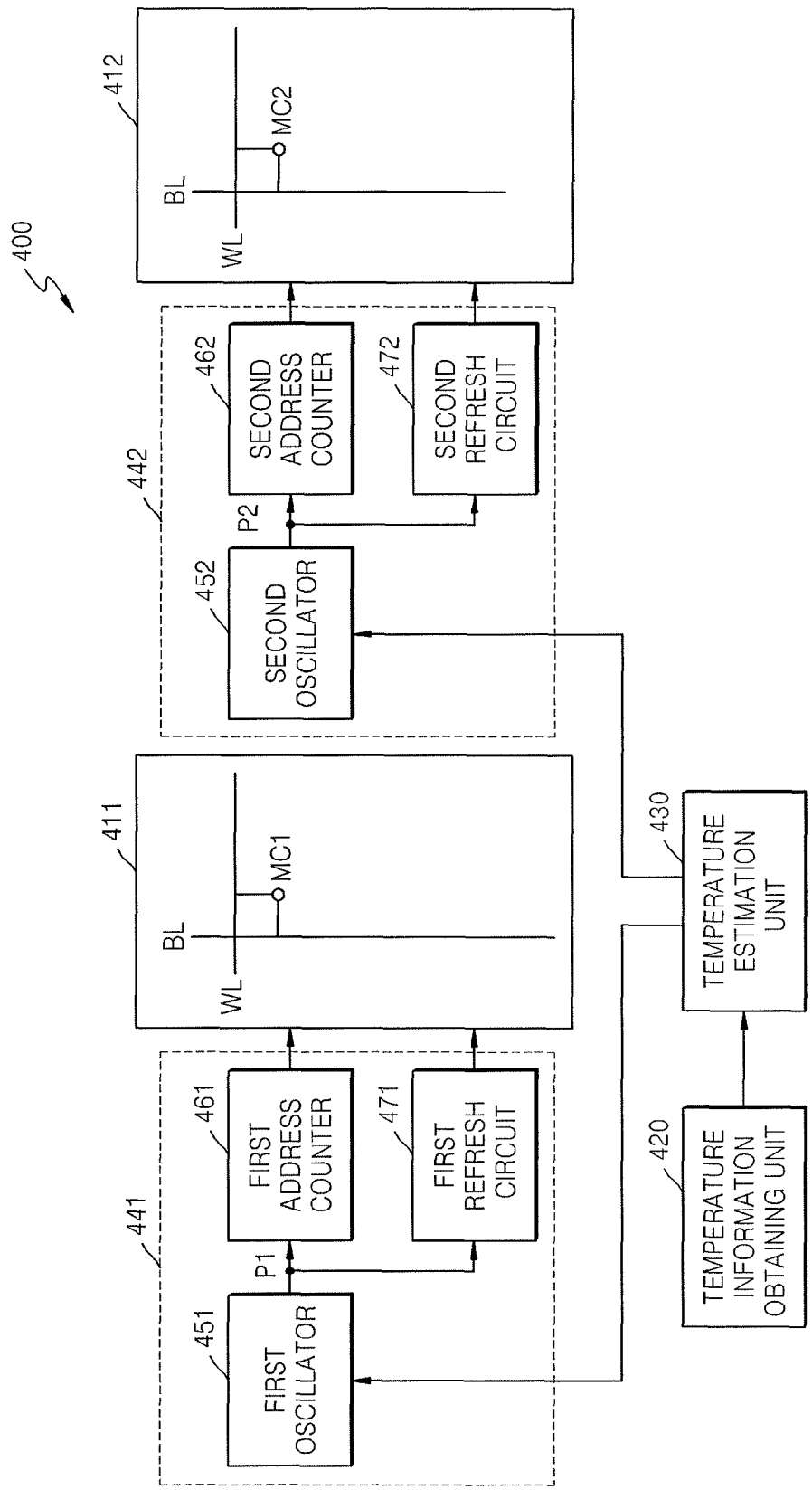
FIG. 4 illustrates another embodiment of a semiconductor memory device.

FIG. 4 illustrates an embodiment of a semiconductor memory device 400 which includes first and second memory sub regions 411 and 412, first and second sub region control units 441 and 442, a temperature information obtaining unit 420, and a temperature estimation unit 430. The semiconductor memory device 400 may be at least partly similar to the semiconductor memory devices 100, 200, and 300 of FIGS. 1, 2, and 3, respectively, except as noted below.

The semiconductor memory device 400 may be a dynamic random access memory (DRAM) and may operate in a self-refresh mode. In general, a refresh operation may include an auto-refresh operation and a self-refresh mode. The auto-refresh operation may be performed in response to a refresh command input from an external device. The self-refresh operation may be performed according to a refresh signal that is periodically and automatically generated internally. In general, the self-refresh operation may be performed in a standby time to reduce power consumption.

The first and second memory sub regions 411, 412 may include a plurality of word lines WL and a plurality of bit lines BL. A plurality of memory cells MC may be disposed at locations where the word lines WL and the bit lines BL cross each other. As shown in FIG. 4, the first memory sub region 411 may include a first memory cell MC1, and the second memory sub region 412 may include a second memory cell MC2. Although the first and second memory sub regions 411 and 412 are only shown in FIG. 4, a greater number of memory sub regions may be included in semiconductor memory device 400 in other embodiments.

In one embodiment, it may be assumed that the first memory sub region 411 includes m number of word lines WL and the second memory sub region 412 includes n number of bit lines BL. The values m and n may be natural numbers greater than 1, and may be different or the same. That is, it may be assumed that all memory cells included in the first memory sub region 411 may be refreshed through m number of refresh operations, and all memory cells included in the second memory sub region 412 may be refreshed through n number of refresh operations.

More specifically, memory cells connected to one word line WL are refreshed through one refresh operation in the present embodiment. In other embodiments, memory cells connected to different word lines WL may be refreshed through one refresh operation.

For example, when the first and second memory sub regions 411, 412 correspond to memory banks having the same size, m and n may be the same. In other embodiments, the first memory sub region 411 may be a part of a memory bank and the second memory sub region 412 may be a remaining part thereof. The first memory sub region 411 may include two memory banks, and the second memory sub region 412 may include one memory bank. According to one example, it may be assumed that n is 2000 and m is 1000.

The temperature information obtaining unit 420 may obtain temperature information, which may be a representative temperature of the semiconductor memory device 400. The representative temperature may be obtained by a temperature sensor installed inside the semiconductor memory device 400 or a reference temperature transmitted from an external device.

The temperature estimation unit 430 may estimate the first estimated temperature $t_1$ of the first memory sub region 411 and the second estimated temperature $t_2$ of the second memory sub region 412. In the present embodiment, it may be assumed that first temperature $t_1$ is 85° C. and the second temperature $t_2$ is 75° C. Also, it may be assumed that the refresh period is 3.2 µs in the case of 85° C. and the refresh period is 6.4 µs in the case of 75° C. Different numerical values may be used in other embodiments.

The first sub region control unit 441 may include a first oscillator 451, a first address counter 461, and a first refresh circuit 471. The second sub region control unit 442 may include a second oscillator 452, a second address counter 462, and a second refresh circuit 472. The first and second sub region control units 441, 442 may be referred to as first and second refresh units, respectively.

The first oscillator 451 may generate a first pulse signal P1 containing 2000 pulses during a first refresh period (for example, 3.2 µs) in correspondence to the first estimated temperature $t_1$. The second oscillator 452 may generate a second pulse signal P2 containing 1000 pulses during a second refresh period (for example, 6.4 µs) in correspondence to the second estimated temperature $t_2$. The first pulse signal P1 may be a signal containing pulses every first refresh cycle time. The second pulse signal P2 may be a signal containing pulses every second refresh cycle time.

The first address counter 461 may increase, one by one, a refresh address of the first memory sub region 411 in response to the first pulse signal P1 generated by the first oscillator 451, in order to generate a first refresh address at which a refresh operation is to be performed. When the first refresh address is a last refresh address, a next refresh address may be an initial refresh address. In the present embodiment, the refresh address may be used to select memory cells in which the refresh operations are to be performed in response to pulses of a pulse signal. When one word line is selected in response to one pulse, the refresh address may correspond to a row address.

The first refresh circuit 471 may refresh memory cells corresponding to the first refresh address generated by the first address counter 461 in response to the first pulse signal P1 generated by the first oscillator 451. In the present embodiment, the first refresh circuit 471 may refresh all memory cells included in the first sub region control unit 441 within the first refresh period (for example, 3.2 µs) corresponding to the first estimated temperature $t_1$ (for example, 85° C.). As a result, the memory cells included in the first sub region control unit 441 may be refreshed every 3.2 µs in correspondence to the first estimated temperature $t_1$ (for example, 85° C.).

The second address counter 462 may increase, one by one, a refresh address of the second memory sub region 412 in response to the second pulse signal P2 generated by the second oscillator 452, in order to generate a second refresh address at which the refresh operation is to be performed.

The second refresh circuit 472 may refresh memory cells corresponding to the second refresh address generated by the second address counter 462, in response to the second pulse signal P2 generated by the second oscillator 452. In the present embodiment, the second refresh circuit 472 may refresh all memory cells included in the second sub region control unit 442 within the second refresh period (for example, 6.4 µs) corresponding to the second estimated temperature $t_2$ (for example, 75° C.). As a result, the memory cells included in the second sub region control unit 442 may be refreshed every 6.4 µs in correspondence to the second estimated temperature $t_2$ (for example, 75° C.).

As previously described, the memory cells included in the first memory sub region 411 and the second memory sub region 412 may be refreshed during different refresh periods according to temperatures. This may prevent data loss from occurring in the memory cells of the first memory sub region 411 with a relatively high temperature. This may also reduce power consumption by preventing frequent refresh operations from being unnecessarily performed on the memory cells of the second memory sub region 412 with a relatively low temperature.

Figure 5:
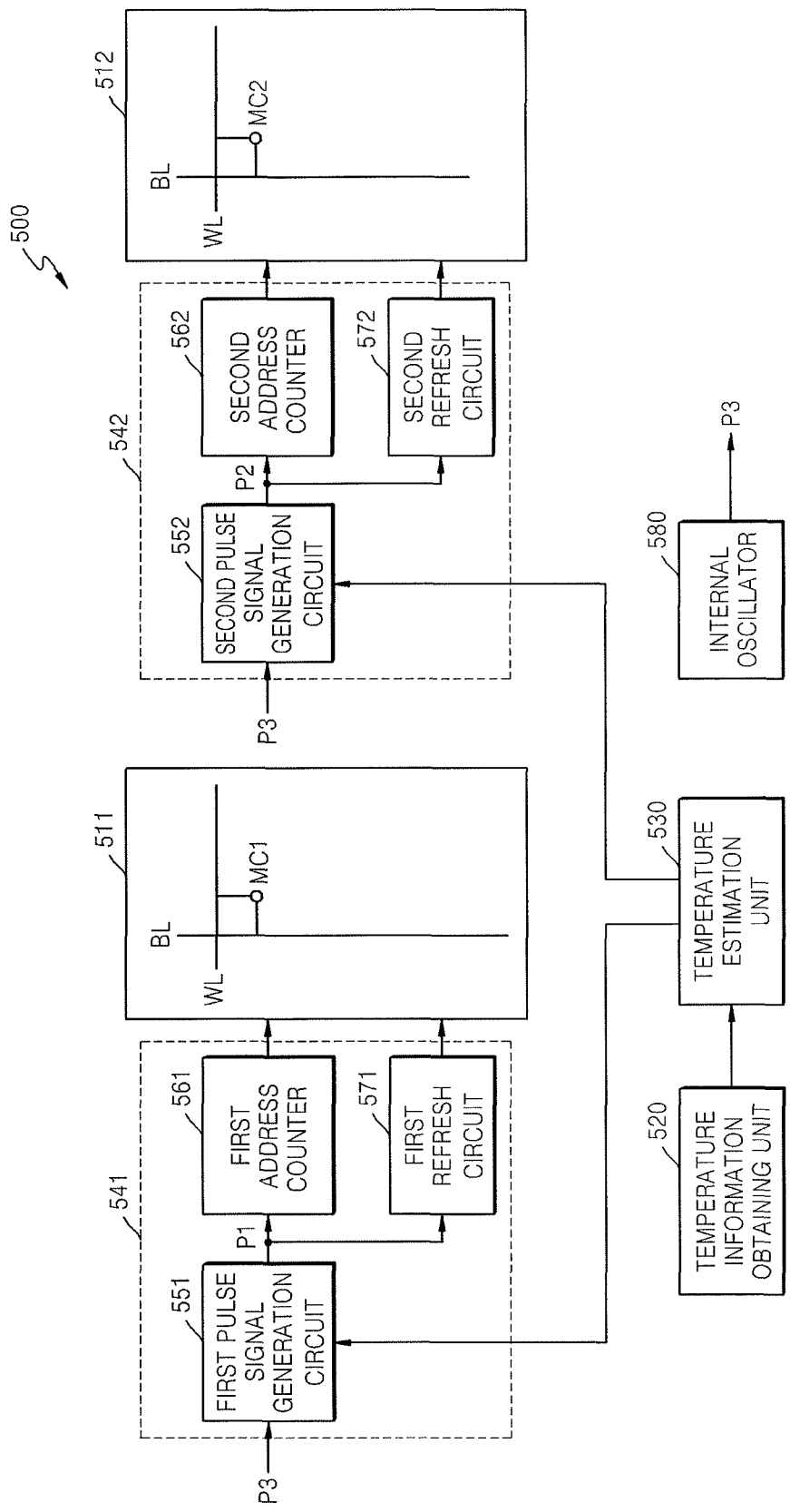
FIG. 5 illustrates another embodiment a semiconductor memory device.

FIG. 5 illustrates another embodiment of a semiconductor memory device 500 which includes first and second memory sub regions 511 and 512, first and second sub region control units 541 and 542, a temperature information obtaining unit 520, a temperature estimation unit 530, and an internal oscillator 580. The semiconductor memory device 500 may be at least partly similar to the semiconductor memory device 400 of FIG. 4, except as noted below.

The semiconductor memory device 500 is a DRAM and may operate in a self-refresh mode. The first and second memory sub regions 511 and 512 may be substantially the same as the first and second memory sub regions 411 and 412 of FIG. 4. The examples and assumptions used to explain the embodiment of FIG. 4 may apply to the present embodiment of FIG. 5.

The temperature information obtaining unit 520 may obtain temperature information. As previously described, the temperature information may be a representative temperature of the semiconductor memory device 500. The representative temperature may be obtained by a temperature sensor inside the semiconductor memory device 500 or a reference temperature transmitted from an external device.

The temperature estimation unit 530 may estimate the first estimated temperature $t_1$ of the first memory sub region 511 and the second estimated temperature $t_2$ of the second memory sub region 512.

The internal oscillator 580 may generate a third pulse signal P3. The third pulse signal P3 may have an invariable (or fixed) period or a period that varies with respect to temperature.

The first sub region control unit 541 may include a first pulse signal generation circuit 551, a first address counter 561, and a first refresh circuit 571. The second sub region control unit 542 may include a second pulse signal generation circuit 552, a second address counter 562, and a second refresh circuit 572.

The first pulse signal generation circuit 551 and the second pulse signal generation circuit 552 may receive the third pulse signal P3 generated by the internal oscillator 580 and may generate the first and second pulse signals P1 and P2 from the third pulse signal P3.

The first pulse signal generation circuit 551 and the second pulse signal generation circuit 552 may respectively include first and second skip circuits that skip some of pulses of the third pulse signal P3, pass the other pulses, and generate the first and second pulse signals P1 and P2. When a pulse frequency of the third pulse signal P3 is the same as a pulse frequency of the first pulse signal P1 or the second pulse signal P2, the corresponding first or second skip circuit may be disabled, pass all the pulses of the third pulse signal P3, and generate the corresponding first or second pulse signal P1 or P2.

In the present embodiment (and the embodiment of FIG. 6), the pulse frequency may indicate a number of pulses generated per hour. Although a pulse signal is usually a periodic signal having a substantially constant period, because the first and second pulse signals P1 and P2 are generated by skipping some of pulses of a periodic pulse signal in the present embodiment, a time interval between the pulses may not be uniform. For example, when two of five pulses input at a uniform interval T skip and the other three pulses pass, a time interval of pulses of an output pulse signal may differ by T or 2T. In this regard, the pulse frequency may not be construed as being limited to a reciprocal number of the pulse period. The pulse frequency defined in the present embodiment (and the embodiment of FIG. 6) may correspond to a reciprocal number of an average pulse period.

In this regard, a refresh cycle or a refresh cycle time may not be uniform. In the present embodiment (and the embodiment of FIG. 6), the refresh cycle or the refresh cycle time is an average refresh cycle or an average refresh cycle time.

In another example, the first pulse signal generation circuit 551 and the second pulse signal generation circuit 552 may respectively include first and second frequency multipliers that multiply a frequency of the third pulse signal P3 at a predetermined ratio. In this regard, the pulse frequency of the third pulse signal P3 may be equal to or lower than a low pulse frequency between a pulse frequency of the first pulse signal P1 and a pulse frequency of the second pulse signal P2. Multiplication ratios of the first and second frequency multipliers may be determined according to the first and second estimated temperatures $t_1$ and $t_2$.

The first pulse signal P1 may have a pulse every first refresh cycle time of 1.6 ns to refresh the memory cells of the first memory sub region 411 every first refresh period (for example, 3.2 μs) in correspondence to the first estimated temperature $t_1$ (for example, 85° C.). That is, the pulse frequency of the first pulse signal P1 is 625 MHz.

The second pulse signal P2 may have a pulse every second refresh cycle time of 6.4 ns to refresh the memory cells of the second memory sub region 412 every second refresh period (for example, 6.4 μs) in correspondence to the second estimated temperature $t_2$ (for example, 75° C.). That is, the pulse frequency of the second pulse signal P2 is 156.25 MHz.

When the first pulse signal generation circuit 551 and the second pulse signal generation circuit 552 respectively include the first and second skip circuits, the first and second pulse signals P1 and P2 are generated by partly or wholly passing the pulses of the third pulse signal P3. Thus, the pulse frequency of the third pulse signal P3 may be at least 625 MHz.

In another example, when the first pulse signal generation circuit 551 and the second pulse signal generation circuit 552 respectively include the first and second frequency multipliers, the first and second pulse signals P1 and P2 are generated from the third pulse signal P3 through frequency multiplication. Thus, the maximum pulse frequency of the third pulse signal P3 needs to be 156.25 MHz.

The internal oscillator 580 may receive the first and second estimated temperatures $t_1$ and $t_2$ of the first memory sub region 511 and the second memory sub region 512. The internal oscillator 580 may generate the third pulse signal P3 having a predetermined pulse frequency based on the first and second estimated temperatures $t_1$ and $t_2$.

In another example, the temperature information obtaining unit 520 may store the first and second estimated temperatures $t_1$ and $t_2$ of the first memory sub region 511 and the second memory sub region 512 in a temperature register. The internal oscillator 580 may read the first and second estimated temperatures $t_1$ and $t_2$ of the first memory sub region 511 and the second memory sub region 512 from the temperature register, and may generate the third pulse signal P3 having the predetermined pulse frequency based on the first and second estimated temperatures $t_1$ and $t_2$.

When the first pulse signal generation circuit 551 and the second pulse signal generation circuit 552 respectively include the first and second skip circuits, the internal oscillator 580 may determine the pulse frequency of the third pulse signal P3 based on the highest temperature between the first and second estimated temperatures $t_1$ and $t_2$ of the first memory sub region 511 and the second memory sub region 512. The first and second skip circuits skip some of pulses. Thus, for example, a pulse signal having a pulse frequency higher than that of the third pulse signal P3 may not be generated by the first and second skip circuits.

When the first pulse signal generation circuit 551 and the second pulse signal generation circuit 552 respectively include the first and second frequency multipliers, the internal oscillator 580 may determine the pulse frequency of the third pulse signal P3 based on the lowest temperature between the first and second estimated temperatures $t_1$ and $t_2$ of the first memory sub region 511 and the second memory sub region 512. The first and second frequency multipliers multiply pulse frequencies. Thus, the pulse signal having the pulse frequency higher than that of the third pulse signal P3 may be generated.

In another example, the temperature information obtaining unit 520 may control the internal oscillator 580. The temperature obtaining unit 520 may control the pulse frequency of the third pulse signal P3 output by the internal oscillator 580 based on the first and second estimated temperatures $t_1$, $t_2$ of the first memory sub region 511 and the second memory sub region 512. For example, when the first pulse signal generation circuit 551 and the second pulse signal generation circuit 552 respectively include the first and second skip circuits, the temperature information obtaining unit 520 may control the internal oscillator 580 to increase the pulse frequency of the third pulse signal P3 if the highest temperature between the first and second estimated temperatures $t_1$ and $t_2$ further increases.

In one embodiment, it may be assumed that the first pulse signal generation circuit 551 and the second pulse signal generation circuit 552 are respectively configured as the first and second skip circuits 551 and 552. However, in other embodiments, the first pulse signal generation circuit 551 and the second pulse signal generation circuit 552 may be respectively configured as the first and second frequency multipliers in the same way as previously mentioned.

The third pulse signal P3 may have an invariable period that does not vary with respect to the first and second estimated temperatures $t_1$ and $t_2$. For example, the third pulse signal P3 may have a pulse frequency of 1,350 MHz. In this case, the first skip circuit 551 skips ½ of the pulses of the third pulse signal P3 and passes the remaining ½ of the pulses. Thus, the first pulse signal P1 with a pulse frequency of 625 MHz may be generated. The second skip circuit 552 skips ⅞ of the pulses of the third pulse signal P3 and passes the remaining ⅛ of the pulses. Thus, the second pulse signal P2 with a pulse frequency of 156.25 MHz may be generated.

When the third pulse signal P3 has the invariable period, the pulse frequency of the third pulse signal P3 may be determined in such a way that memory cells of the first memory sub region 511 and the second memory sub region 512 may be refreshed during a refresh period corresponding to a maximum operable temperature of the semiconductor memory device 500. In other embodiments, the first and second memory sub regions 511 and 512 may be refreshed during a refresh period corresponding to a predetermined temperature which is different from a maximum operable temperature.

The third pulse signal P3 may have a variable period that varies with respect to the first and second estimated temperatures $t_1$ and $t_2$. In this case, the pulse frequency of the third pulse signal P3 may be determined in such a way that memory cells of the first memory sub region 511 or the second memory sub region 512 may be refreshed during a refresh period corresponding to the highest temperature between the first and second estimated temperatures $t_1$ and $t_2$ of the first memory sub region 511 and the second memory sub region 512. In the present embodiment, since temperature of the first memory sub region 511 is higher than that of the second memory sub region 512, the pulse frequency of the third pulse signal P3 may be determined to be the same as that of the first pulse signal P1, so that the memory cells of the first memory sub region 511 may be refreshed.

The first skip circuit 551 may determine a ratio for skipping the pulses of the third pulse signal P3 in correspondence to the first estimated temperature $t_1$ estimated by the temperature estimation unit 530. The second skip circuit 552 may determine a ratio for skipping the pulses of the third pulse signal P3 in correspondence to the second estimated temperature $t_2$ estimated by the temperature estimation unit 530. A relationship between the temperature and the skip ratio may be stored in a register. The register may be included in the first and second skip circuits 551, 552 or in the temperature estimation unit 530. When the register is included in the temperature estimation unit 530, the temperature estimation unit 530 may provide the first and second skip circuits 551, 552 with the skip ratios along with, or instead of, the first and second estimated temperatures $t_1$ and $t_2$.

The first address counter 561 increases, one by one, a refresh address of the first memory sub region 511 in response to the first pulse signal P1 generated by the first skip circuit 551. Thus, a first refresh address may be generated on which a refresh operation is to be performed. The first refresh circuit 571 may refresh memory cells corresponding to the first refresh address generated by the first address counter 561 in response to the first pulse signal P1.

The second address counter 562 increases, one by one, a refresh address of the second memory sub region 512 in response to the second pulse signal P2 generated by the second skip circuit 552. Thus, a second refresh address may be generated on which the refresh operation is to be performed. The second refresh circuit 572 may refresh memory cells corresponding to the second refresh address generated by the second address counter 562 in response to the second pulse signal P2.

The memory cells of the first memory sub region 511 and the second memory sub region 512 may be refreshed during different refresh periods according to temperatures. This may prevent data loss from occurring in the memory cells of the first memory sub region 511 at a relatively high temperature, and may reduce power consumption by preventing frequent refresh operations from being unnecessarily performed on the memory cells of the second memory sub region 512 at a relatively low temperature.

Figure 6:
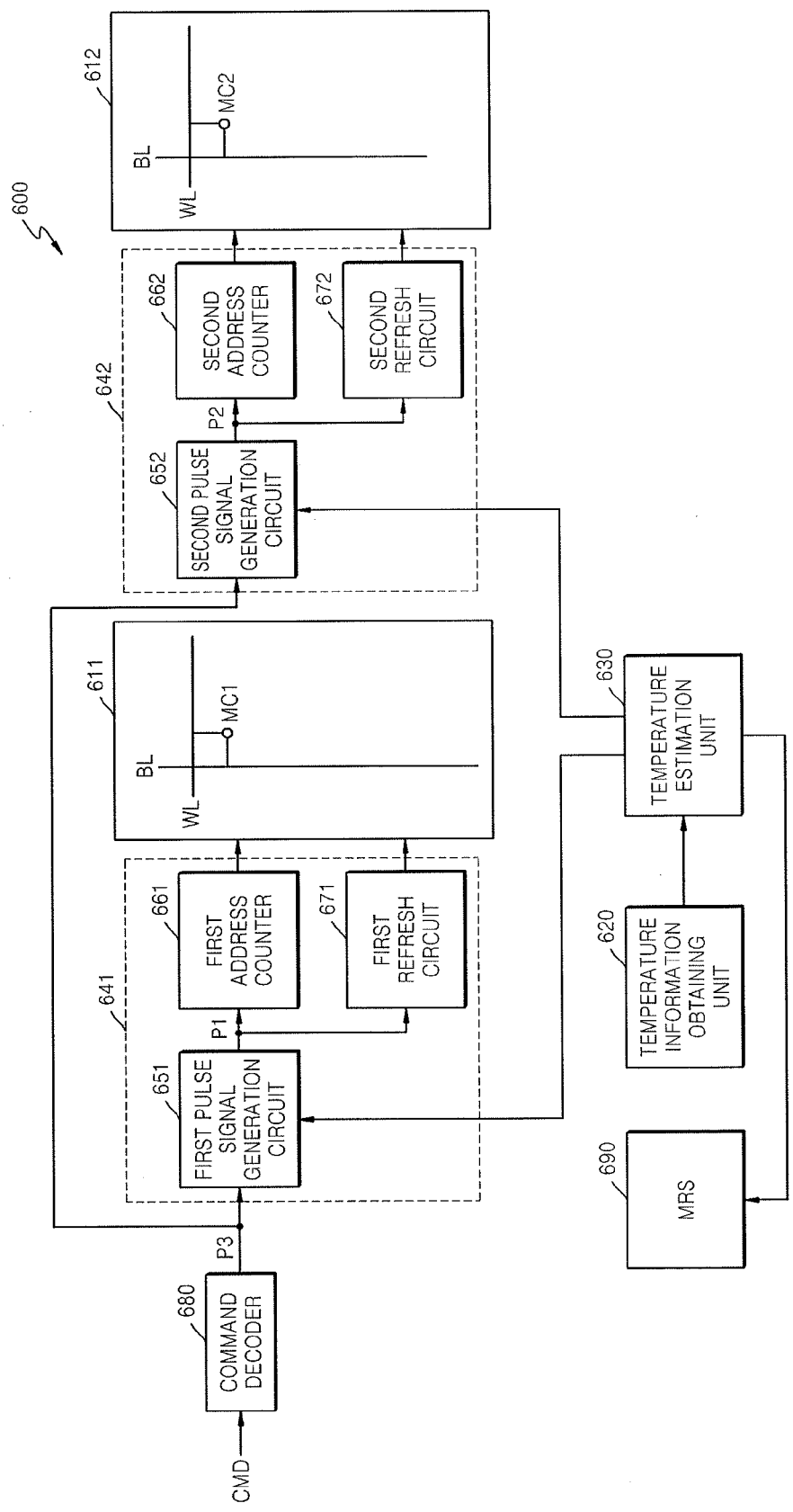
FIG. 6 illustrates another embodiment of a semiconductor memory device.

FIG. 6 illustrates another embodiment of a semiconductor memory device 600 which includes first and second memory sub regions 611 and 612, first and second sub region control units 641 and 642, a temperature information obtaining unit 620, a temperature estimation unit 630, and a command decoder 680. The semiconductor memory device 600 may be at least partly similar to the semiconductor memory device 500 of FIG. 5, except as noted below.

The semiconductor memory device 600 is a DRAM and may operate in an auto-refresh mode. The first and second memory sub regions 611 and 612 may be substantially the same as first and second memory sub regions 411 and 412 of FIG. 4.

The temperature information obtaining unit 620 may obtain temperature information. As previously described, the temperature information may be a representative temperature of the semiconductor memory device 600. The representative temperature may be obtained by a temperature sensor inside the semiconductor memory device 600 or a reference temperature transmitted from an external device.

The temperature estimation unit 630 may estimate the first estimated temperature $t_1$ of the first memory sub region 611 and the second estimated temperature $t_2$ of the second memory sub region 612.

The command decoder 680 may generate a command signal corresponding to a command CMD transmitted from an external device, such as the CPU 303, the GPU 305, or the memory controller 307 of FIG. 3, based on the command CMD.

The external device may record and read data to and from the semiconductor memory device 600, as well as control a refresh operation of the semiconductor memory device 600. The external device may provide the semiconductor memory device 600 with a refresh command. The semiconductor memory device 600 may perform a refresh operation in response to the refresh command. The semiconductor memory device 600 may determine a refresh address that is to be refreshed using a refresh counter in response to the refresh command, and may perform the refresh operation on memory cells corresponding to the refresh address.

The command decoder 680 may generate the third pulse signal P3 containing a pulse generated in response to the refresh command transmitted from the external device. The external device may provide the refresh command during an invariable (or fixed) period or a variable period with respect to temperature according to a mode register setting (MRS) 690 of the semiconductor memory device 600.

The MRS 690 may store information regarding a refresh operating mode of the semiconductor memory device 600. The MRS 690 may store information regarding a temperature of the semiconductor memory device 600 or information regarding a refresh period corresponding to the temperature.

The temperature estimation unit 630 may store the highest estimated temperature between the first estimated temperature $t_1$ of the first memory sub region 611 and the second estimated temperature $t_2$ of the second memory sub region 612 in the MRS 690. Alternatively, information regarding a refresh period corresponding to the highest estimated temperature may be stored in the MRS 690.

The external device may determine a refresh period based on information regarding the highest estimated temperature stored in the MRS 690, and may provide the refresh command according to the refresh period. The third pulse signal P3 may contain the pulse in response to the refresh command.

The first sub region control unit 641 may include a first pulse signal generation circuit 651, a first address counter 661, and a first refresh circuit 671. The second sub region control unit 642 may include a second pulse signal generation circuit 652, a second address counter 662, and a second refresh circuit 672.

The first and second sub region control units 641 and 642 may be substantially the same as the first and second sub region control units 541 and 542 described with reference to FIG. 5.

The first pulse signal generation circuit 651 and the second pulse signal generation circuit 652 may receive the third pulse signal P3 generated by the command decoder 680, and may respectively generate the first and second pulse signals P1 and P2 based on the third pulse signal P3. The first and second pulse signal generation circuits 651 and 652 may be respectively configured as first and second skip circuits or first and second frequency multipliers.

When the first and second pulse signal generation circuits 651 and 652 are respectively configured as the first and second skip circuits 651 and 652, the first skip circuit 651 may determine a ratio for skipping pulses of the third pulse signals P3 in response to the first estimated temperature $t_1$ estimated by the temperature estimation unit 630. The second skip circuit 652 may determine a ratio for skipping the pulses of the third pulse signals P3 in response to the second estimated temperature $t_2$ estimated by the temperature estimation unit 630.

The first address counter 661 increases, one by one, a refresh address of the first memory sub region 611 in response to the first pulse signal P1 generated by the first skip circuit 651. Thus, a first refresh address may be generated on which a refresh operation is to be performed. The first refresh circuit 671 may refresh memory cells corresponding to the first refresh address generated by the first address counter 661 in response to the first pulse signal P1.

The second address counter 662 increases, one by one, a refresh address of the second memory sub region 612 in response to the second pulse signal P2 generated by the second skip circuit 652. Thus, a second refresh address may be generated on which the refresh operation is to be performed. The second refresh circuit 672 may refresh memory cells corresponding to the second refresh address generated by the second address counter 662 in response to the second pulse signal P2.

Figure 7:
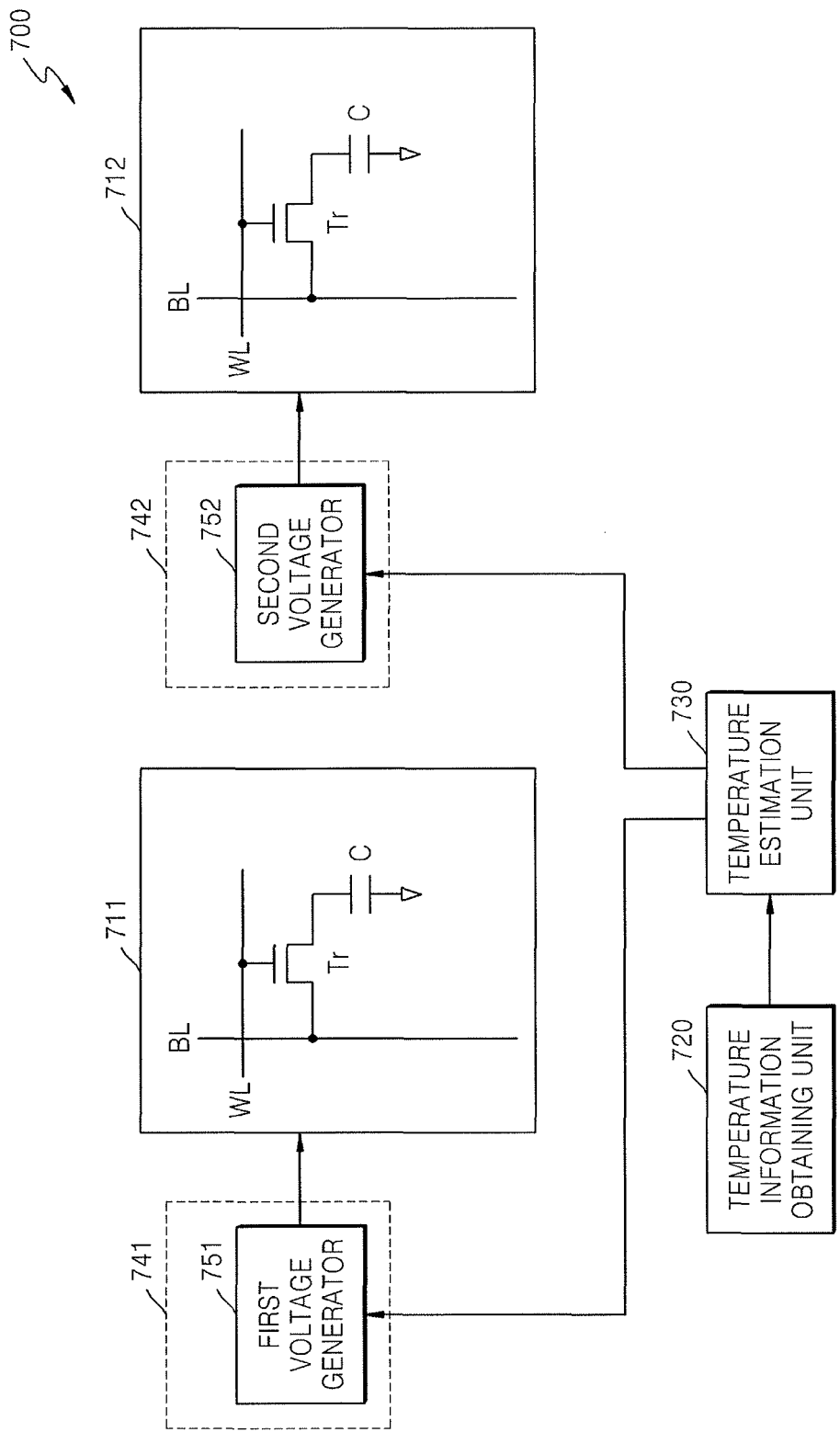
FIG. 7 illustrates another embodiment of a semiconductor memory device.

FIG. 7 illustrates another embodiment of a semiconductor memory device 700 which includes first and second memory sub regions 711 and 712, first and second sub region control units 741 and 742, a temperature information obtaining unit 720, and a temperature estimation unit 730. The semiconductor memory device 700 may be at least partly similar to the semiconductor memory devices 100-500 of FIGS. 1 through 6, respectively, except as noted below. The semiconductor memory device 700 may be a DRAM or another type of memory device, such as but not limited to a flash memory device.

Each of the first and second memory sub regions 711 and 712 includes the plurality of word lines WL, the plurality of bit lines BL, and memory cells MC. Each of the memory cells MC may include a transistor Tr and a capacitor C. A gate of the transistor Tr is connected to the word lines WL. If a turn-on voltage is applied to the word lines WL, the bit lines BL are electrically connected to the capacitor C.

The transistor Tr has a threshold voltage Vt. If a turn-on voltage higher than the threshold voltage Vt is applied to the gate of the transistor Tr, a channel is formed. If a turn-on voltage lower than the threshold voltage Vt is applied to the gate of the transistor Tr, a channel is not formed.

The threshold voltage Vt of the transistor Tr may vary with respect to temperature. For example, if the temperature increases, the threshold voltage Vt may decrease. Conversely, if the temperature decreases, the threshold voltage Vt may increase. If the temperature increases, the transistor Tr may be turned on even though a low voltage is applied to the transistor Tr. If the temperature decreases, the transistor Tr may be turned on when a high voltage is applied to the transistor Tr.

The temperature information obtaining unit 720 may obtain temperature information. The temperature information obtaining unit 720 may estimate the first estimated temperature $t_1$ of the first memory sub region 711 and the second estimated temperature $t_2$ of the second memory sub region 712 based on the temperature information.

The first sub region control unit 741 may include a first voltage generator 751. The second sub region control unit 742 may include a second voltage generator 752.

The first voltage generator 751 may generate a voltage applied to the word lines WL. More specifically, the first voltage generator 751 may generate a turn on voltage for turning the transistor Tr on and a turn off voltage for turning the transistor Tr off. The turn on voltage is applied to enable a corresponding memory cell. The turn off voltage is applied to disable a corresponding memory cell.

For example, when data is stored in a corresponding memory cell, the data is read from the corresponding memory cell, or the corresponding memory cell is refreshed, and the turn on voltage is applied to the world line WL connected to the corresponding memory cell. In this case, memory cells connected to the other word lines WL need to be disabled. Thus, the turn off voltage is applied to the other word lines WL.

The first voltage generator 751 may generate a first control voltage including a first turn on voltage and a first turn off voltage based on the first estimated temperature $t_1$ estimated by the temperature estimation unit 730. The first turn on voltage and first turn off voltage are applied to the word lines WL of the first sub region control unit 741. The lower the first control voltage, the higher the first estimated temperature $t_1$.

The second voltage generator 752 may generate a second control voltage including a second turn on voltage and a second turn off voltage based on the second estimated temperature $t_2$ estimated by the temperature estimation unit 730. The second turn on voltage and second turn off voltage are applied to the word lines WL of the second sub region control unit 742. The lower the second control voltage, the higher the second estimated temperature $t_2$. Thus, when the first estimated temperature $t_1$ is higher than the second estimated temperature $t_2$, the first control voltage may be lower than the second control voltage.

In another example, the first voltage generator 751 may generate a first bulk voltage applied to the first memory sub region 711 based on the first estimated temperature $t_1$ estimated by the temperature estimation unit 730. The second voltage generator 752 may generate a second bulk voltage applied to the second memory sub region 712 based on the second estimated temperature $t_2$ estimated by the temperature estimation unit 730. In this case, a bias path of the first bulk voltage and the second bulk voltage may be separated from each other. The first and second voltage generators 751 and 752 may include a bulk bias detector and a voltage pumping circuit, respectively.

Therefore, the semiconductor memory device 700 may increase data reliability and reduce power consumption by applying an appropriate control voltage according to a corresponding temperature, even though temperatures of the first and second memory sub regions 711 and 712 are different.

Although the first and second sub region control units 741 and 742 of FIG. 7 include the first and second voltage generators 751 and 752, respectively, the first and second sub region control units 441, 442, 541, 542, 641, and 642 may respectively include the first and second voltage generators 751 and 752.

Figure 8:
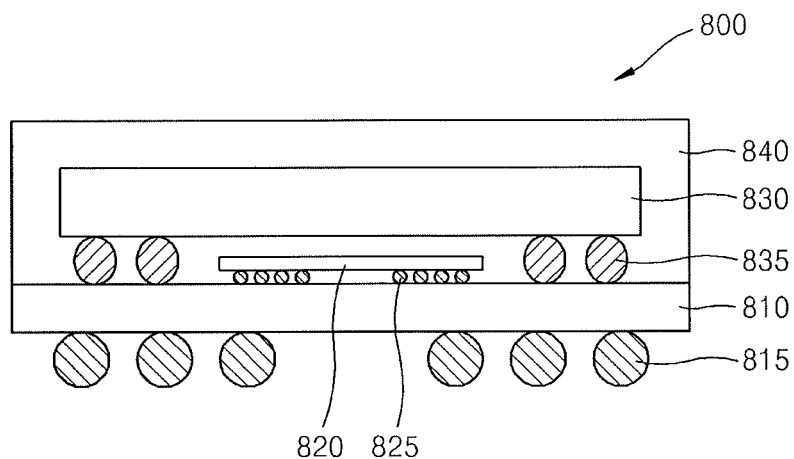
FIG. 8 illustrates an embodiment of a semiconductor package.

FIG. 8 illustrates a embodiment of a semiconductor package 800 which includes a base substrate 810 (e.g., a printed circuit board), a semiconductor chip 820 disposed on the base substrate 810, and at least one semiconductor memory chip 830 disposed on the semiconductor chip 820.

The semiconductor chip 820 may include an application processor unit including a CPU block and a GPU block or a microprocessor unit (MPU). The semiconductor chip 820 may correspond to the semiconductor device 302 described with reference to FIG. 3.

The semiconductor memory chip 830 may include a memory unit including a first memory sub region and a second memory sub region, a temperature information obtaining unit that obtains temperature information, a temperature estimation unit that estimates a first temperature of the first memory sub region and a second temperature of the second memory sub region based on the temperature information, a first sub region control unit that controls memory cells of the first memory sub region based on the first temperature, and a second sub region control unit that controls memory cells of the second memory sub region based on the second temperature.

The semiconductor memory chip 830 may include a memory unit that includes a plurality of memory banks, a temperature detection unit that detects a representative temperature, a temperature estimation unit that estimates a temperature of each of the memory banks based on the representative temperature, and a plurality of refresh units that refresh memory cells of a corresponding memory bank during a refresh period corresponding to the temperature of each of the memory banks estimated by the temperature estimation unit.

The semiconductor chip 820 may include a temperature sensor, the semiconductor memory chip 830 may include a temperature sensor, or both the semiconductor chip 820 and the semiconductor memory chip 830 may include temperature sensors.

The semiconductor memory chip 830 may include a plurality of memory banks, a temperature information obtaining unit that obtains the temperature information from the temperature sensor, a temperature estimation unit that estimates the temperature of each of the memory banks based on the temperature information, and a plurality of memory bank control units that control the corresponding memory banks based on the corresponding estimated temperatures of the memory banks.

The semiconductor memory chip 830 may correspond to the semiconductor memory devices 100, 200, 300, 400, 500, 600, and 700 described with reference to FIGS. 1 through 7, respectively. The semiconductor chip 820 and the semiconductor memory chip 830 may be stacked on the base substrate 810, and then a resin 840 may be coated on an upper portion of the semiconductor package 800.

In the illustrative embodiment shown in FIG. 8, the semiconductor memory chip 830 and the base substrate 810 may be electrically connected to each other via an input/output bump 835 of semiconductor memory chip 830. In another embodiment, the semiconductor memory chip 830 and the base substrate 810 may be electrically connected to each other using a wire bonding method. The semiconductor chip 820 and the base substrate 810 may be electrically connected to each other via micro input/output bumps 825 of the semiconductor chip 820. In another embodiment, the semiconductor chip 820 and the base substrate 810 may be electrically connected to each other using a wire bonding method. A bump 815 may be formed in a lower surface of the base substrate 820 for an electrical connection between the base substrate 810 and an external device.

In FIG. 8, the semiconductor chip 820 is disposed below the semiconductor memory chip 830. In an alternative embodiment, the semiconductor memory chip 830 may be disposed below the semiconductor chip 820.

Also, in FIG. 8, semiconductor chip 820 is connected to the semiconductor memory chip 830 through the base substrate 810. In another embodiment, the semiconductor chip 820 is disposed below the semiconductor memory chip 830, and the two may be directly connected to each other, for example, using input/output bumps or a bonding wire.

Also, in FIG. 8, one semiconductor chip 820 and one semiconductor memory chip 830 are shown. In another embodiment, semiconductor package 800 may include a plurality of semiconductor chips 820 and a plurality of semiconductor memory chips 830.

Figure 9:
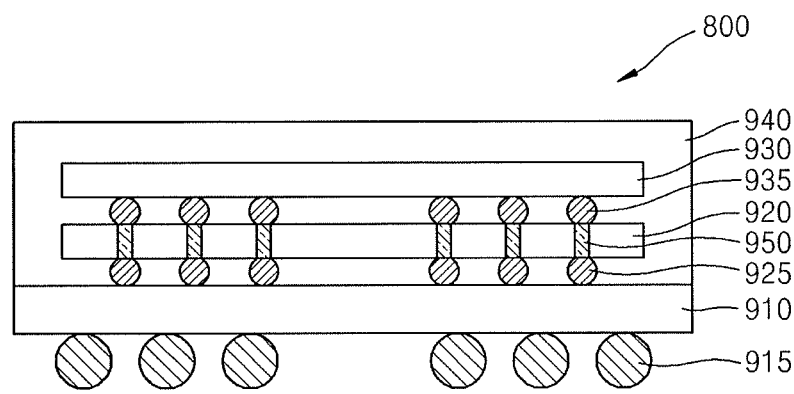
FIG. 9 illustrates another embodiment of a semiconductor package.

FIG. 9 illustrates another embodiment of a semiconductor package 900 which includes a base substrate 910, a semiconductor chip 920 disposed on the base substrate 910, and at least one semiconductor memory chip 930 disposed on the semiconductor chip 920.

The base substrate 910, the semiconductor chip 920, and the semiconductor memory chip 930 may respectively correspond to the base substrate 810, the semiconductor chip 820, and the semiconductor memory chip 830 of FIG. 8. The semiconductor chip 920 and the semiconductor memory chip 930 may be stacked on the base substrate 910, and then a resin 940 may be coated on an upper portion of the semiconductor package 900.

In the illustrative embodiment shown in FIG. 9, the semiconductor chip 920 may include a through silicon via (TSV) 950. The semiconductor chip 920 and the base substrate 910 may be electrically connected to each other via micro input/output bumps 925 connected to the TSV 950 of the semiconductor chip 920. The semiconductor memory chip 930 may be electrically connected to the semiconductor chip 920 via micro input/output bumps 935 connected to the TSV 950 of the semiconductor chip 920. The semiconductor memory chip 930 may be electrically connected to the base substrate 910 via the TSV 950.

When the base substrate 910, the semiconductor chip 920, and the semiconductor memory chip 930 are electrically connected to each other via the TSV 950, an interface load resistance between the base substrate 910 and the semiconductor memory chip 930 may be reduced. As a result, signal transmission may be readily implemented.

A bump 915 may be formed on a lower surface of the base substrate 920 for an electrical connection between the base substrate 910 and an external device.

In FIG. 9, the semiconductor chip 920 is disposed below the semiconductor memory chip 930. In another embodiment, the semiconductor memory chip 930 may be disposed below the semiconductor chip 920. In this case, the TSV 950 may be formed in the semiconductor memory chip 930.

FIG. 8 illustrates the semiconductor package 800 in which the semiconductor memory devices 100-700 are packaged in a package on package (PoP) manner. FIG. 9 illustrates the semiconductor package 900 in which the semiconductor memory devices 100-700 use the TSV 950. In addition, the semiconductor memory devices 100-700 may be packaged in ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), or the like.

By way of summation and review, one or more embodiments are directed to different control characteristics of a semiconductor memory device for each bank according to temperature, thereby increasing data reliability and reducing power consumption.

One or more embodiments estimate temperatures for each of the banks based on a representative temperature detected by one temperature sensor, and independently controls banks based on the estimated temperatures of the banks.

Also, one or more embodiments may receive temperature information from an external device (for example, an application processor which is packaged and integrated with the semiconductor memory device).

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory, comprising:
a memory unit including a first memory sub region having a first memory cell and a second memory sub region having a second memory cell;
a temperature information provider to provide temperature information;
a temperature estimator to estimate a first temperature of the first memory sub region and a second temperature of the second memory sub region based on the temperature information, the temperature estimator to estimate the first and second temperatures based on predetermined relationship information indicative of a relationship between the temperature information and the first and second temperatures;
a first sub region controller to control the first memory sub region based on the first temperature, the first sub region controller is to refresh the first memory cell during a first refresh period corresponding to the first temperature; and
a second sub region controller to control the second memory sub region based on the second temperature, the second sub region controller is to refresh the second memory cell during a second refresh period corresponding to the second temperature, wherein:
the first memory sub region has m number of refresh addresses;
the second memory sub region has n number of refresh addresses, where m and n are natural numbers greater than 1;
the first sub region controller includes:
a first oscillator to generate a first pulse signal including m number of pulses during the first refresh period in correspondence to the first temperature,
a first address counter to generate a first refresh address indicating a refresh address of the first memory sub region where a refresh operation is to be performed in response to the first pulse signal, and
a first refresh circuit to refresh memory cells corresponding to the first refresh address in response to the first pulse signal; and
the second sub region controller includes:

a second oscillator to generate a second pulse signal including n number of pulses during the second refresh period in correspondence to the second temperature,
a second address counter to generate a second refresh address indicating a refresh address of the second memory sub region where the refresh operation is to be performed in response to the second pulse signal, and
a second refresh circuit to refresh memory cells corresponding to the second refresh address in response to the second pulse signal.

2. A semiconductor memory, comprising:
a memory unit including a first memory sub region having a first memory cell and a second memory sub region having a second memory cell;
a temperature information provider to provide temperature information;
a temperature estimator to estimate a first temperature of the first memory sub region and a second temperature of the second memory sub region based on the temperature information, the temperature estimator to estimate the first and second temperatures based on predetermined relationship information indicative of a relationship between the temperature information and the first and second temperatures;
a first sub region controller to control the first memory sub region based on the first temperature, the first sub region controller is to refresh the first memory cell during a first refresh period corresponding to the first temperature; and
a second sub region controller to control the second memory sub region based on the second temperature, the second sub region controller is to refresh the second memory cell during a second refresh period corresponding to the second temperature, wherein:
the first memory sub region has m number of refresh addresses;
the second memory sub region has n number of refresh addresses, where m and n are natural numbers greater than 1;
the first sub region controller includes:
a first pulse signal generation circuit to receive a third pulse signal and to generate a first pulse signal having m number of pulses during the first refresh period from the third pulse signal,
a first address counter to generate a first refresh address indicating a refresh address of the first memory sub region where a refresh operation is to be performed in response to the first pulse signal, and
a first refresh circuit to refresh memory cells corresponding to the first refresh address in response to the first pulse signal; and
the second sub region controller includes:
a second pulse signal generation circuit to receive the third pulse signal and to generate a second pulse signal having n number of pulses during the second refresh period from the third pulse signal,
a second address counter to generate a second refresh address indicating a refresh address of the second memory sub region at which the refresh operation is to be performed in response to the second pulse signal, and
a second refresh circuit to refresh memory cells corresponding to the second refresh address in response to the second pulse signal.

3. The device as claimed in claim 2, wherein the first pulse signal generation circuit and the second pulse signal generation circuit respectively include a first skip circuit and a second skip circuit that partially or wholly pass pulses of the third pulse signal.

4. The device as claimed in claim 3, wherein a pulse frequency of the third pulse signal is equal to or higher than a higher of a pulse frequency of the first pulse signal and a pulse frequency of the second pulse signal.

5. The device as claimed in claim 2, further comprising:
an internal oscillator to generate the third pulse signal.

6. The device as claimed in claim 2, wherein the third pulse signal is generated in response to a refresh command received from an external device.

* * * * *